United States Patent [19]

Fujihira

[11] Patent Number: 5,031,009
[45] Date of Patent: Jul. 9, 1991

[54] CONDUCTIVITY MODULATION SEMICONDUCTOR WITH NO NEGATIVE RESISTANCE CHARACTERISTICS

[75] Inventor: Tatsuhiko Fujihira, Matsumoto, Japan

[73] Assignee: Fuji Electric Co., Ltd., Kawasaki, Japan

[21] Appl. No.: 230,238

[22] Filed: Aug. 9, 1988

[30] Foreign Application Priority Data

Aug. 13, 1987 [JP] Japan ................... 62-202220

[51] Int. Cl.$^5$ ........................... H01L 29/78
[52] U.S. Cl. ................... 357/23.4; 357/23.8; 357/38
[58] Field of Search .............. 357/23.4, 23.8, 38

[56] References Cited

U.S. PATENT DOCUMENTS 4,639,761 1/1987 Singer et al. ............ 357/23.4
4,985,741 1/1991 Bauer et al. ............ 357/23.4

FOREIGN PATENT DOCUMENTS 61-216363 9/1986 Japan ................... 357/23.4

Primary Examiner—Rolf Hille
Assistant Examiner—Steven Loke
Attorney, Agent, or Firm—Brumbaugh, Graves, Donohue & Raymond

[57] ABSTRACT

A conductivity modulation type Metal-Oxide Semiconductor Field Effect Transistor is disclosed having no negative resistance characteristics and which can withstand a high voltage and operate at a high speed. The semiconductor is constructed with a low density intermediate layer between a buffer layer and the silicon substrate. The density of the intermediate layer, lower than adjacent layers, induces minority carrier injection across the buffer layer thereby eliminating the negative resistance characteristic.

8 Claims, 1 Drawing Sheet

CONDUCTIVITY MODULATION SEMICONDUCTOR WITH NO NEGATIVE RESISTANCE CHARACTERISTICS

BACKGROUND OF THE INVENTION

This invention relates to a conductivity modulation type Metal-Oxide Semiconductor Field Effect Transistor ("MOSFET") and, in particular, to a conductivity modulation type MOSFET which has no negative resistance in the operating range of its I-V characteristic.

FIG. 2 represents an example of a conventional conductivity modulation type MOSFET The following description assumes that the first conductive type is an N-type and the second conductive type is a P-type. Typically, the MOSFET has a P-type silicon substrate 2 formed by epitaxial growth of an N− type buffer layer 3 and an N-type high resistance layer 4. Next, a P+ type low resistance layer 7, a P-type base layer 5 and an N+ type source region 8 are formed by means of diffusion. Part of an insulating layer 9, formed on top of the silicon substrate, has a gate layer 10 on top of it. The rest of the insulating layer 9 is formed over the gate layer 10. Formed over the insulating layer are a source electrode 11 and a drain electrode 12. In such a conventional type MOSFET, the impurity density of the N+ buffer layer 3 typically exceeds $10^{17}$ cm$^{-3}$ in order to prevent punch-through caused by the elongation of a depletion layer at the time of forward voltage. This also acts to shorten the switching time while maintaining the ON resistance at a low value.

When a thick N-type high resistance layer is used to allow the FET to block a high voltage and when electron beam irradiation or gold or platinum diffusion is used to shorten the switching time, the resulting current-voltage characteristic has a negative resistance area. This characteristic is represented by curve B in FIG. 3. This phenomenon makes the MOSFET significantly more difficult to use than a device with a normal I-V characteristic. Curve A represents a normal I-V characteristic.

SUMMARY OF THE INVENTION

It is an object of the present invention to provide a conductivity modulation type MOSFET that has no negative resistance area in the I-V characteristic as shown by curve A in FIG. 3. Another objective of the present invention is to provide a conductivity modulation type MOSFET which can block high voltage and operate at a high speed.

In short, according to the present invention, an impurity density of an intermediate layer is formed between a P+ substrate and an N+ buffer layer in a PN junction J1. The presence of this intermediate layer permits injection of minority carriers from the PN junction J1 at even a lower current density so as to prevent negative resistance such as that shown with a curve B in FIG. 3 from being created.

DESCRIPTION OF THE PREFERRED EMBODIMENTS

Figure 1:
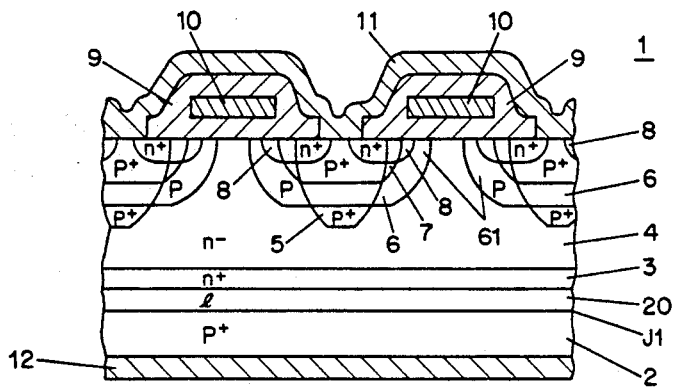
FIG. 1 is a cross-sectional view showing a principal part of an embodiment according to the present invention.
Figure 2:
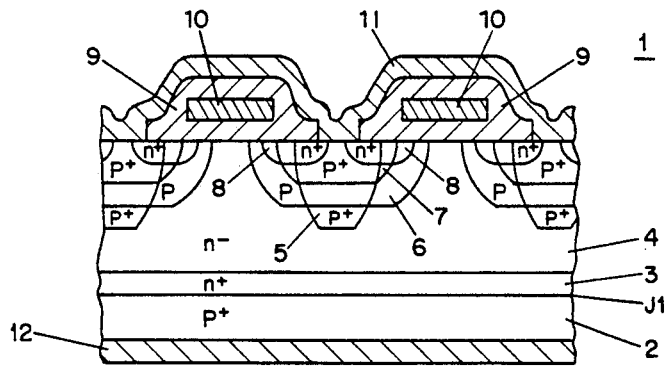
FIG. 2 is a cross-section view showing a principal part of a conventional conductivity modulation type MOSFET.
Figure 3:
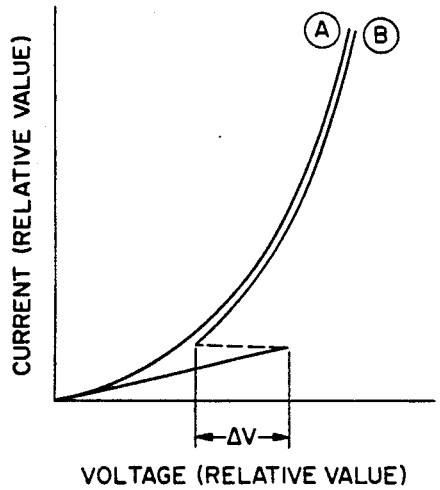
FIG. 3 is a diagram showing a normal desirable curve A and an abnormal curve B of the current voltage characteristic of a conductivity modulation type MOSFET.

FIG. 1 shows an embodiment of the present invention. Those parts that are common to those shown in FIG. 2 are affixed with common marks. In this embodiment, an impurity density of a PN junction J1 is lowered by providing a low density intermediate layer 20 between an N+ buffer layer 3 which is a high density intermediate layer of a first conductive type and a P+ type silicon substrate 2 which is a high density layer of a second conductive type. This low density layer may be of either P-type or N-type. In either case the PN junction J1 is formed in this low density layer. Other respective regions and respective electrodes may be formed in a similar manner using conventional techniques.

Figure 4:
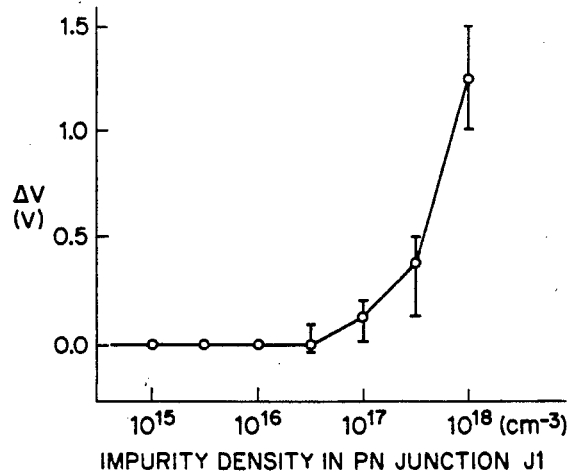
FIG. 4 is a diagram showing a variation (V) of the voltage area where negative resistance is generated when the impurity density of a PN junction J1 is varied.

In FIG. 4, the variation of a voltage range ΔV in a negative resistance area is plotted at a certain turn-off time when the impurity density of the PN junction J1 is changed in various ways. As shown, the negative area does not appear in cases where the impurity density of the PN junction J1 is less than $3 \times 10^{16}$ cm$^{-3}$. Moreover, according to this embodiment, it is possible to lower the impurity density of the PN junction J1 without lowering the density of the N+ buffer. Therefore, the negative resistance area may be deleted without increasing the ON resistance.

According to the present invention, the impurity density of the PN junction J1, which is a supply source of minority carriers of a conductive modulation type MOSFET, is lowered so that minority carriers may be injected even at lower current density. Thus, the negative resistance area of a conductive modulation type MOSFET may be deleted.

Furthermore, by providing a low density intermediate layer between the N+ buffer layer and the P+ type silicon substrate as described above, the impurity density of the PN junction J1 is lowered. Accordingly, the density of the N+ buffer can be maintained high notwithstanding the insertion of the intermediate layer, thereby effectively preventing an increase in the ON resistance.

I claim:

1. In a conductivity modulation type MOSFET having high resistance layer of a first conductive type, a base region of a second conductive type, different from said first conductive type formed in said high resistance layer and a source region of a first conductive type formed in said base region, and characterized by a desirable low ON resistance and undesirable negative resistance characteristic, the improvement comprising the following combination;

a continuous high impurity density buffer layer of a first conductive type coupled to said high resistance layer and arranged to prevent punch-through while maintaining said low ON resistance, a high impurity density semiconductor substrate of a second conductive type and an intermediate layer disposed between and of lower impurity density than said substrate and said buffer layer so as to lower the impurity density of the P-N junction between said substrate and said buffer layer;

whereby said intermediate layer is effective to substantially eliminate the negative resistance characteristic while maintaining a low ON resistance characteristic of the MOSFET.

2. A conductivity modulation type MOSFET according to claim 1 wherein said intermediate layer comprises a thin layer relative to said buffer layer.

3. A conductivity modulation type MOSFET according to claim 1 wherein said intermediate layer comprises a layer of said first conductive type.

4. A conductivity modulation type MOSFET according to claim 1 wherein said intermediate layer comprises a layer of said second conductive type.

5. In a conductivity modulation type MOSFET having a high resistance layer of a first conductive type, a base region of a second conductive type, different from said first conductive type, formed in said high resistance layer, a source region of a first conductive type formed in said base region, a semiconductor substrate having a drain electrode coupled thereto, an insulated gate formed on said high resistance layer, a source electrode formed on exposed portions of said base and source regions not covered by said insulated gate layer, and characterized by a desirable low ON resistance and undesirable negative resistance characteristic, the improvement comprising the following combination:

a continuous high impurity density buffer layer of a first conductive type coupled to said high resistance layer and arranged to prevent punch-through while maintaining said low ON resistance, said semiconductor substrate being a high impurity density substrate of a second conductive type and an intermediate layer means disposed between and of lower impurity density than said substrate and said buffer layer for lowering the impurity density of the P-N junction between said substrate and said buffer layer;

whereby said intermediate layer is effective to substantially eliminate the negative resistance characteristic while maintaining a low ON resistance characteristic of the MOSFET.

6. A conductivity modulation type MOSFET according to claim 5 wherein said intermediate layer comprises a thin layer relative to said buffer layer.

7. A conductivity modulation type MOSFET according to claim 5 wherein said intermediate layer comprises a layer of said first conductive type.

8. A conductivity modulation type MOSFET according to claim 5 wherein said intermediate layer comprises a layer of said second conductive type.

* * * * *

UNITED STATES PATENT AND TRADEMARK OFFICE
CERTIFICATE OF CORRECTION

PATENT NO. : 5,031,009
DATED : July 9, 1991
INVENTOR(S) : Tatsuhiko Fujihira

It is certified that error appears in the above-identified patent and that said Letters Patent is hereby corrected as shown below:

Column 1, line 17, "N- type buffer layer" should read --$N^+$ type buffer layer--;

Column 1, line 18, "N-type" should read --$N^-$ type--;

Column 1, line 29, "time of" should read --time of blocking--.

Signed and Sealed this

Sixteenth Day of February, 1993

Attest:

STEPHEN G. KUNIN

Attesting Officer

Acting Commissioner of Patents and Trademarks